(12) United States Patent
Hess

(10) Patent No.: US 9,297,579 B2
(45) Date of Patent: Mar. 29, 2016

(54) PASSIVELY COOLED PROTECTIVE INSTRUMENT HOUSING

(71) Applicant: Martin Hess, Ingolstadt (DE)

(72) Inventor: Martin Hess, Ingolstadt (DE)

( * ) Notice: Subject to any disclaimer, the term of this patent is extended or adjusted under 35 U.S.C. 154(b) by 310 days.

(21) Appl. No.: 13/910,291

(22) Filed: Jun. 5, 2013

(65) Prior Publication Data

US 2013/0333400 A1 Dec. 19, 2013

(30) Foreign Application Priority Data

Jun. 5, 2012 (DE) .......................... 10 2012 011 032

(51) Int. Cl.
| | |
|---|---|
| *F25D 17/02* | (2006.01) |
| *F25D 31/00* | (2006.01) |
| *F28D 15/00* | (2006.01) |
| *F28D 20/00* | (2006.01) |
| *H05K 7/20* | (2006.01) |
| *H02B 1/56* | (2006.01) |

(52) U.S. Cl.
CPC ................ *F25D 31/00* (2013.01); *F25D 17/02* (2013.01); *F28D 15/00* (2013.01); *F28D 20/0039* (2013.01); *H05K 7/20681* (2013.01); *H02B 1/56* (2013.01); *Y02E 60/142* (2013.01)

(58) Field of Classification Search
CPC ........... H05K 7/20681; H05K 7/20609; F28D 20/0039; F28D 15/00; F25D 17/02; Y02E 60/142; Y02E 60/147; H02B 1/56
USPC .......... 62/518, 516, 519, 62, 259.2, 443, 444, 62/446
See application file for complete search history.

(56) References Cited

U.S. PATENT DOCUMENTS

| | | | | |
|---|---|---|---|---|
| 4,293,030 | A | * 10/1981 | Rambach | .......................... 165/96 |
| 5,005,379 | A | * 4/1991 | Brown | ............................ 62/434 |
| 8,072,752 | B2 | 12/2011 | Wantschik | |
| 2010/0288380 | A1 * | 11/2010 | Sicre et al. | ................ 137/561 R |
| 2011/0277746 | A1 * | 11/2011 | Smyth | ........................... 126/618 |

FOREIGN PATENT DOCUMENTS

| | | |
|---|---|---|
| DE | 20 2005 018 777 U1 | 3/2006 |
| DE | 10 2008 012 200 A1 | 9/2009 |
| DE | 10 2008 022 000 A1 | 11/2009 |

(Continued)

*Primary Examiner* — Marc Norman
*Assistant Examiner* — Ana Vazquez
(74) *Attorney, Agent, or Firm* — Laurence A. Greenberg; Werner H. Stemer; Ralph E. Locher

(57) ABSTRACT

A passively cooled instrument protective housing has an internal heat exchanger, an external heat exchanger, and a storage tank for a cooling medium and disposed in a housing interior. A cooling unit having a cooling unit evaporator is disposed in the storage tank and in which a cooling unit coolant is evaporated with the use of heat from the storage tank cooling medium. A condenser or a liquefier is disposed outside the housing and in which the vaporous or gaseous cooling unit coolant emanating from the cooling unit evaporator is liquefied. A switching and/or shut-off device is provided, by which the cooling unit can be switched off and/or can be uncoupled from the passive cooling system formed by the internal and external heat exchangers and by the storage tank. In addition, a control and/or regulating device is provided, which same is operatively connected to the cooling unit.

3 Claims, 1 Drawing Sheet

(56) References Cited

FOREIGN PATENT DOCUMENTS

| | | |
|---|---|---|
| DE | 10 2008 027 584 B3 | 12/2009 |
| DE | 102009060398 A1 | 6/2011 |
| EP | 1612500 A2 | 1/2006 |
| WO | 9908354 A1 | 2/1999 |
| WO | 2007/134695 A1 | 11/2007 |

* cited by examiner

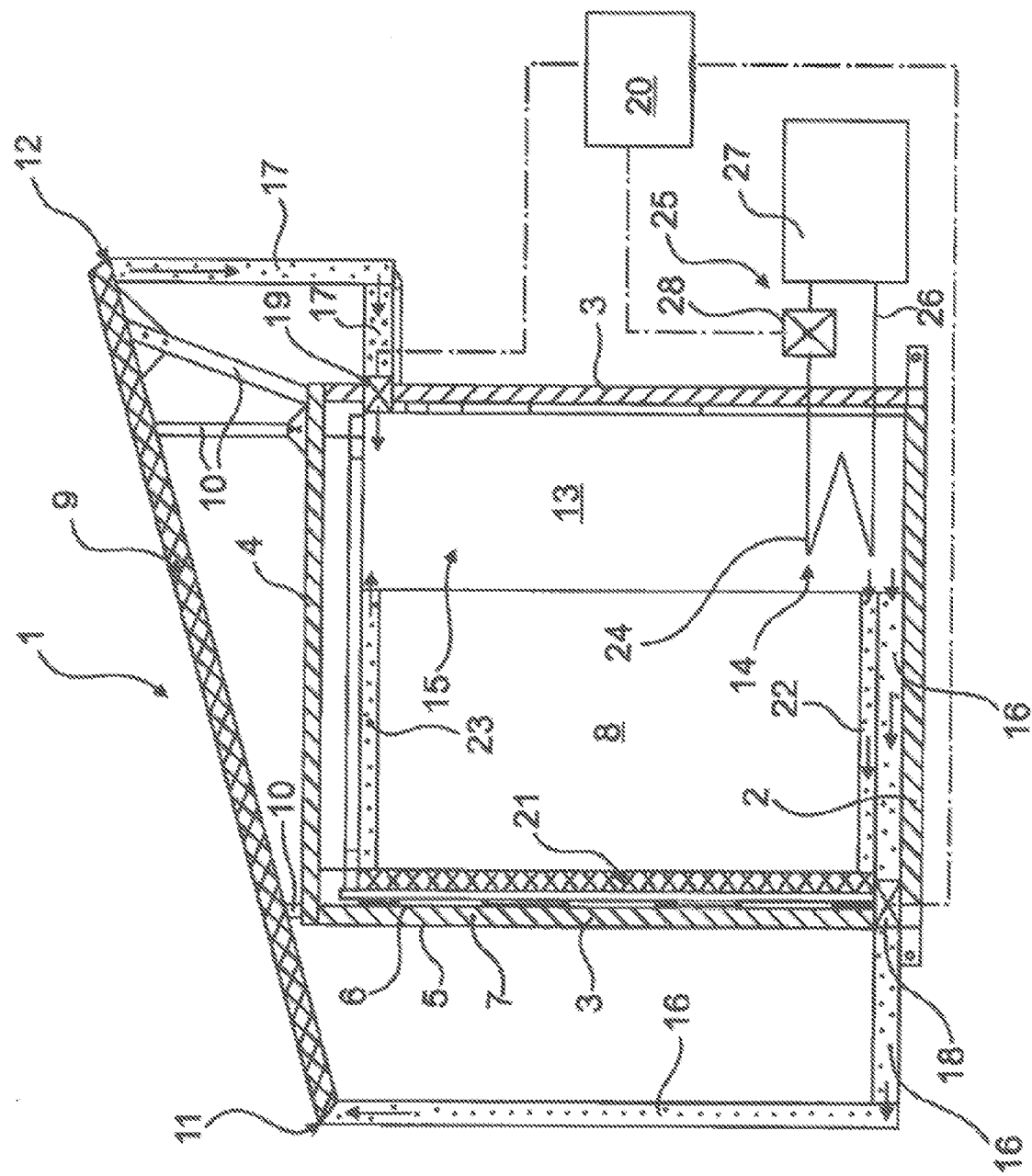

PASSIVELY COOLED PROTECTIVE INSTRUMENT HOUSING

BACKGROUND OF THE INVENTION

Field of the Invention

The invention relates to a passively cooled instrument protective housing, in particular to a passively cooled instrument shelter for components to be protected which are accommodated therein.

Instrument protective housings are known in various embodiments, such as, for example, as instrument protection boxes, which are of relatively compact configuration and can be fastened, for example, to a wall or a process line and in which smaller electrical instruments are disposed. In addition, in particular in connection with large-scale industrial use, large-volume and bulky protective housings as instrument shelters are known, in which correspondingly bulky electrical or electronic instruments and analyzers can be received and kept safe. Such instrument houses as protective housings are used, for example, as analysis houses for environmental measuring stations, for mobile radio stations in the telecommunications sector, for switchgear as rectifier housings, as well as gas regulating stations. Large-volume protective housings or instrument shelters of this kind are regularly constructed of a ceiling wall, side walls and a base wall, wherein the walls are formed by a plurality of mutually connected, plate-like wall elements. For instance, plate-like wall elements of this type are formed by sandwich panels, which are respectively made up of a stable outer skin and a stable inner skin, as well as of a heat insulating layer situated between the outer skin and the inner skin. Compared to a traditional brick construction or a concrete prefabricated construction, for example, these thus constructed instrument shelters have the advantage of having a lower total weight, which allows assembly in and on buildings and/or steel frame constructions.

Furthermore, instrument shelters of this type are completely transportable and can be ready equipped in the workshop, for example with heating systems, air conditioning systems, electrical installations, lighting systems, pipe and cable bushings, assembly systems, etc.

In particular where instrument shelters or protective housings are used in climatic zones of the kind in which very high temperature fluctuations are given, for example in desert regions, there is the danger that undesirable condensation in the interior of the protective housing or instrument shelter can ensue, which, in turn, can damage the electrical instruments and analyzers disposed therein or can impact negatively on these same with respect to their measurement results. In such extremely climatic conditions, for example in desert areas, furthermore, the external temperatures can be so high, particularly by day, that the danger of impairment of or damage to the sensitive instruments and analyzers has likewise to be addressed.

From WO 99/08354, a cabinet-type housing for the reception of heat generating, electrical and/or electronic structural units is already known. For the evacuation of heat from the interior, the side walls are of double-walled configuration and respectively consist of an inner wall and an outer wall, between which remains a vacant interspace. The interspaces in the walls are open upward and downward, that is to say have a flow connection to the environment, in order that, when fans are actuated, the ambient air on the bottom of the walls is sucked up and passes out of the walls again at the top. When the interspaces are flowed through, the air streams absorb heat from the inner walls and evacuate this heat into the environment. The double-walled side walls are formed by aluminum extrusion profiles, which form hollow chamber profiles. In addition to this so-called external cooling circuit, in the interior of the housing a second, internal cooling circuit, which is fluidically fully separate from the external cooling circuit, can also be installed.

A similar construction is also known from DE 295 92 60 U1 in connection with a weather-protected electronic switch cabinet, in which the double-walled structure is achieved, however, by means of a protective hood which surrounds the switching train. In concrete terms, in one embodiment a single heat exchanger is here integrated into the structure such that an endothermic heat exchanger part is situated in the cabinet itself and an exothermic heat exchanger part is situated in the protective roof. The air as heat exchanging medium is here sucked through the structure by means of fans. With a structure of this type too, in particular in climatic zones of the kind in which very high temperatures exist, particularly by day, no satisfactory climatization of an interior of the protective housing is possible, so that undesirable condensation in the interior of the protective housing can ensue.

Furthermore, EP 1 612 500 A2 discloses an instrument protective housing in which a section of the housing wall is configured as a heat exchanger wall region, wherein an internal heat exchanger, by means of which a heat exchange with the interior of the protective housing can be implemented, is integrated into the heat exchanger wall region. This internal heat exchanger is fluidically connected to an external heat exchanger, by means of which a heat exchange with the external environment of the protective housing can be implemented, wherein the internal and external heat exchangers, fluidically connected to each other, respectively have a predefined holding volume for a predefined quantity of a water as the heat exchanger fluid, which water can be circulated between said heat exchangers in a closed system. In such a structure, it is necessary to ensure, by a high level of complexity, that the wall region is designed liquid-tight.

In addition, DE 10 2009 060 398 A1 discloses a passively cooled instrument protective housing having an internal heat exchanger and an external heat exchanger, which are indirectly fluidically connected to each other via a stratified storage unit as the storage tank. If it is detected by a control and/or regulating device, for example, that an interior temperature exceeds a predefined threshold value, a pump is activated and cold water is correspondingly pumped into the inner heat exchanger, while, at the same time, hot, warm water is fed into the warm water region of the storage tank via an output line leading out from the internal heat exchanger. Hence, as a result of heat exchange, the temperature in the interior of the protective housing then falls below a predefined value. By contrast, in those cases in which the external and ambient temperature falls below the interior temperature, which, at night, is regularly the case in desert regions, for example, cold water is fed in stratified arrangement into the storage tank by means of the external heat exchanger. A passively cooled instrument protective housing of this type already has a number of advantages. It has been shown, however, that a passively cooled instrument protective housing of this type is often unusable in extreme conditions, since, with water, for example, as the cooling medium, the necessary temperature differences are not achieved.

BRIEF SUMMARY OF THE INVENTION

By contrast, the object of the present invention is to provide a passively cooled instrument protective housing, in particular a passively cooled instrument shelter for components to be protected which are accommodated therein, by means of which housing, in a simple and functionally reliable manner, a constantly optimal heat exchange with the housing interior can be realized in order to protect the components to be protected, which are disposed there, from excessive temperatures.

This object is achieved with the features of the main patent claims. Advantageous embodiments hereof are the subject of the subclaims.

According to patent claim 1 there is proposed a passively cooled instrument protective housing, in particular a passively cooled instrument shelter for components to be protected which are accommodated therein, such as, for instance, electrical and/or electronic equipment, which has at least one internal heat exchanger, disposed in the housing interior, and at least one external heat exchanger, disposed outside the housing. In addition, a storage tank, disposed in the housing interior and configured as a stratified storage unit, for a cooling medium is provided, in which the cooling medium is stored in stratified arrangement in different temperature zones. The at least one internal and the at least one external heat exchanger respectively have at least one output line, by means of which cooling medium warmed in the respective heat exchanger can be fed to the storage tank. In addition, the at least one internal and the at least one external heat exchanger respectively have at least one input line, by means of which cold cooling medium from the storage tank can be fed to the respective heat exchanger. According to the invention at least one cooling unit is provided, which cooling unit has at least one cooling unit evaporator, which is disposed in the storage tank and in which a cooling unit coolant is evaporated with the extraction of heat from the storage tank cooling medium, and at least one condenser or liquefier, which is disposed outside the housing and in which the vaporous or gaseous cooling unit coolant emanating from the cooling unit evaporator is liquefied. In addition, at least one switching and/or shut-off device is provided, by means of which the cooling unit can be switched off and/or can be uncoupled from the passive cooling system formed by the at least one internal and external heat and by the storage tank. Finally, a control and regulating device is provided, which control and regulating device is operatively connected to the cooling unit in such a way that the cooling unit, in dependence on defined parameters, in particular in dependence on time and/or temperature parameters, is activated or deactivated. Particular preference is here given to an embodiment in which the cooling unit is activated whenever an actual temperature of the storage tank cooling medium, registered by the control and/or regulating device, exceeds a predefined target temperature, while the cooling unit is deactivated or switched off when an actual temperature of the storage container cooling medium, registered by the control and/or regulating device, is no greater than or falls below the defined target temperature. Preferably, it is here provided that the target temperature is predefined in dependence on an interior actual temperature which is to be set or can be set in the interior of the housing. Alternatively or additionally, this pure temperature regulation could also be coupled with a time control system, which, for instance, causes the cooling unit to be activated at specific times or certain times of day and is switched off, for example, once a target temperature has been reached.

With an inventive solution of this type, the use of a passive cooling system for instrument protective housings becomes easily possible even in climatic zones of the kind in which, temporarily, no cooling of the storage tank cooling medium such that a specific actual temperature value in the housing interior can be provided by heat exchange is possible. For the cooling unit, the start-up of which is controlled or regulated by the control and regulating device, ensures that a sufficient quantity of cool coolant is always available at such times to allow a desired interior temperature level to be reliably regulated.

Particular preference is here given to an embodiment in which the at least one cooling unit evaporator is integrated into a cold zone of the storage tank. For it is thereby ensured that a sufficiently cool quantity of coolant is provided precisely at the site where cooling water is drawn off and led to the internal heat exchanger.

According to one particularly preferred embodiment, it is proposed that the external heat exchanger is configured as a lamellar heat exchanger extending over at least one section above a roof wall or ceiling wall of the housing, wherein the external, lamellar heat exchanger is angled to the horizontal. With a lamellar heat exchanger of this type (not to be confused with a plate heat exchanger), on the one hand a type of sunshield, by means of which the roof wall or ceiling wall is shielded from direct solar radiation, is easily formed. On the other hand, an inclined heat exchanger arrangement of this type also serves to ensure that the cooling medium present in the heat exchanger can in the warmed state climb upward to the geodetically highest point, thereby promoting natural convection.

At this point it should be very expressly mentioned that pumps can also of course be connected up to the external and internal heat exchanger circuits, which pumps, at predefined times, convey a defined quantity of the cooling medium into the respective heat exchangers, or draw said quantity out of these. In principle, however, as mentioned already previously in brief, the possibility is also given to use no such pumps or other conveying devices, but rather to effect the heat exchange merely by natural convection. The use of pumps or conveying devices is heavily dependent on the respectively concretely given usage conditions and temperature gradients.

According to a further particularly preferred embodiment, it is proposed that the external, lamellar heat exchanger is arranged at a distance, at least a gap distance, above the roof wall or ceiling wall. To this end, the external, lamellar heat exchanger can be supported on the roof wall or ceiling wall by, for instance, struts or a frame. With such a distance, it is easily ensured that no thermal interaction between the external heat exchanger and the ceiling wall, which might possibly impact negatively on the heat exchanger result, takes place.

According to a further particularly preferred embodiment of the present inventive concept, it is proposed that the external, lamellar heat exchanger has an input line which, starting from a geodetically low region of the heat exchanger and/or distanced from a side wall of the housing, is guided downward in the direction of a base wall of the housing and preferably at the bottom to a cold zone of the storage tank. Also a concrete structure of this type substantially helps to promote the convection and the flow of the cooling medium in the cold or warmed-up state, so that the use of pumps or like conveying devices can possibly be relinquished.

The aforesaid applies analogously to an embodiment according to which it is proposed that the external, lamellar heat exchanger has an output line which, starting from a geodetically higher situated region of the heat exchanger and/or distanced from a side wall of the housing, is guided through a side wall of the housing to a warm zone of the storage tank.

According to a further particularly preferred embodiment, it is proposed that the at least one internal heat exchanger is disposed on an inner wall of the housing and/or is integrated into an inner wall of the housing. A compact structure of the housing, which little comprises the interior and has an internal heat exchanger, is hereby provided. For instance, hosepipes or pipelines laid in a winding pattern could here be provided on the wall side, which are thermally insulated in the direction of the housing outer side and are covered, in the direction of the tank inner side or of the tank interior, for example, by means of a heat-conducting plate, for instance an aluminum plate or the like, whereby a reliable heat exchange with the housing interior can be realized. Of course, an embodiment and arrangement of an internal heat exchanger in which the coils are laid freely on the tank inner wall is also possible.

Analogously, the external heat exchanger can be formed by, for example, hose lines and/or pipelines laid in a winding pattern. Such a structure of the internal and external heat exchangers can be produced in a functionally reliable manner with relatively simple means.

Also in connection with the at least one internal heat exchanger, preference is given to an embodiment in which the at least one internal heat exchanger has an input line which is guided, starting from a geodetically low region of the heat exchanger, preferably at the bottom to a cold zone of the storage tank. It can further be provided that the at least one internal heat exchanger has an output line which, starting from a geodetically higher region of the heat exchanger, is guided preferably on the ceiling side or roof side to a warm zone of the storage tank.

With this type of concrete embodiment and arrangement of the input and output line of the internal heat exchanger, an arrangement of the medium lines which follows the natural convection and which is altogether conducive to the passive cooling is possible. Moreover, the interior region is here compromised relatively little with respect to the available volume.

The storage tank cooling medium can be formed, in principle, by any suitable cooling medium. Particularly advantageous results can be obtained in connection with the passive cooling if the storage tank cooling medium is water.

According to a further particularly preferred embodiment of the present inventive concept, it can be provided that at least one switching and/or shut-off device for the external heat exchanger is provided, by means of which the flow connection between the storage tank and the external heat exchanger can be shut off. This at least one switching and/or shut-off device for the external heat exchanger is preferably coupled with the control and regulating device such that the external heat store is shut off if it is detected by means of the control and regulating device that the outer wall temperature or ambient temperature outside the housing is equally as great or greater than the temperature inside the housing. Conversely, the external heat exchanger is switched on if it is detected by means of the control and regulating device that the external or ambient temperature outside the housing falls below the temperature inside the housing, because then a reliable feed of cool cooling medium into the storage tank becomes possible. In principle, there are here various options for configuration of the switching and/or shut-off device, for example through the use of possibly provided pumps which can be easily switched on or off. In principle, however, an embodiment in which a shut-off element or elements is or are respectively integrated into the output line and into the input line to the external heat exchanger, is also possible, wherein the arrangement of the shut-off elements is realized preferably in that section of the output and input line which is disposed on the housing side. A reliable shut-off of the external heat exchanger thereby becomes possible.

In addition, a method for operating a passively cooled instrument protective housing is claimed, in particular, an instrument shelter having a structure by means of which a process management becomes possible, as have both been previously described. The advantages which are thereby obtainable have already been stated in connection with the extensive appraisal of the instrument protective housing, so that reference is here made to the previously made statements in order to avoid unnecessary repetitions.

The invention is explained in greater detail below with reference to a drawing.

BRIEF DESCRIPTION OF THE DRAWING

The single FIGURE of the drawing is a diagrammatic, cross-sectional view of an instrument protective housing.

DESCRIPTION OF THE INVENTION

The single FIGURE shows schematically a cross section through an instrument shelter 1, which has a base wall 2, side walls 3 and a ceiling wall 4, and here, as represented by way of example in FIG. 1, has a rectangular cross section. The base wall 2, the side walls 3 and the ceiling wall 4 are preferably formed by sandwich panels, which are formed of a stable outer skin 5 and a stable inner skin 6 distanced therefrom, in each case preferably made of a glass fiber reinforced plastics material, between which an insulating layer 7, for example PU foam or a special mineral wool or the like, is arranged. The instrument shelter 1 is accessible, for instance, via a door (not represented here), wherein, in the interior 8 of the instrument shelter, structural elements (not represented here) which are to be protected from high temperatures are disposed and accommodated. Structural elements of this type can be, for example, electrical or electronic measuring equipment or the like, which is used, for example, in connection with the monitoring of installations in desert areas.

Above the ceiling wall 4, at a distance from the ceiling wall 4, is disposed an external, lamellar or roof-shaped heat exchanger 9, which is held and supported by struts 10 of different height, to be precise such that the lamellar external heat exchanger 9 is inclined at a predetermined angle to the horizontal.

The external heat exchanger 9 has a planar extent such that it shields the ceiling wall 4 from above over a large area and thus forms a type of sunshield, which more or less protects the ceiling wall 4 and thus the Instrument shelter 1 from direct solar radiation.

Branching off from a geodetically lowest connection region of this external heat exchanger 9 is an input line 16, which is guided at a distance from the side wall 3 of the instrument shelter 1 downward in the direction of the base wall 2 and is guided there through the side wall 3 at the bottom to a storage tank 13 accommodated in the interior 8. This storage tank 13 is configured as a stratified storage unit, in which, for instance, water is stored as a cooling medium in stratified arrangement in different temperature zones. The lower region of the storage tank 13 here forms the so-called cold zone 14, in which cold water is stored, while the, by comparison, geodetically upper region of the storage tank 13 forms a so-called warm zone 15, in which, relative to the cold zone 14, warmer water is stored.

As can be seen from FIG. 1, the input line 16, branching off from the connection region 11, of the external heat exchanger 9 thus opens out at the bottom into the cold zone 14 of the storage tank 13.

To the geodetically upper connection region 12 of the external heat exchanger 9 is connected an output line 17, which, at a distance from the side wall 3, is guided downward and through the side wall 3 in the upper region close to the ceiling wall through the side wall 3 and opens out there into the warm zone 15 of the storage tank 13. For instance in the area of penetration of the input line 16 and of the output line 17 through the side walls 3 can be arranged a switching and/or shut-off element 18, 19, which, as shown in dash-dot representation in FIG. 1, is coupled for signaling purposes with a control and regulating device 20, wherein the control and regulating device 20 controls the switching and/or shut-off elements 18, 19 for the shut-off or uncoupling of the external heat exchanger 9, as is described in greater detail below. The switching and/or shut-off elements 18, 19 can be formed, for example, by possibly provided pumps, which can then easily be switched off or on in order to enable or shut off the desired flow.

In the interior 8 of the instrument shelter 1 is disposed, for example in the region of the side walls 3 an internal heat exchanger 21, which at the geodetically lowest point is provided with an input line 22, which opens out into the cold zone 14 of the storage tank 13. An output line 23 of the internal heat exchanger 21 is branched off at the geodetically uppermost point and opens out into the warm zone 15 of the storage tank 13. While the input line 22 is laid preferably at the base, the output line 23 runs preferably at the ceiling.

Both the internal and the external heat exchanger 9, 21 are formed, for instance, by cooling coils, which are flowed through by the water stored in the storage tank 13, whereupon a heat exchange with the external environment (external heat exchanger 9) or with the interior 8 (internal heat exchanger 21) then takes place in a manner which is known per se.

In a manner which is not shown here, a pumping and/or conveying device can be connected up to the circuit to the internal heat exchanger 21, as well as to the circuit to the external heat exchanger 9, which pumping and/or conveying device can be used to feed the water into and through the heat exchangers in the desired direction of conveyance.

Into the cold zone 14 of the storage tank 13 is also integrated an evaporator 14 (shown here merely in schematic representation) of a cooling unit 25, which is fluidically connected via a pipeline 26 to a liquefier 27 (condenser) disposed outside the instrument shelter 1. The cooling unit 25 constitutes a separate cooling medium circuit, in which circulates a cooling medium which evaporates in the evaporator 24 with the absorption of heat from the cold zone 14 of the storage tank and is then liquefied again in the liquefier 27.

The control and regulating device 20 is operatively connected, for example via a switching and/or shut-off device 28, e.g. a relay or a shut-off valve, in such a way to the cooling unit 25 that the cooling unit is only activated when an actual temperature of the storage tank cooling medium which is registered by the control and regulating device 20 exceeds a predefined target temperature. On the other hand, the cooling unit 25 is deactivated or switched off by means of the control and regulating device 20, by activation and actuation of the switching and/or shut-off device 28, when an actual temperature of the storage tank cooling medium (water) which is registered by the control and/or regulating device is no greater than or falls below the predefined target temperature. To this end, it is preferably provided that the target temperature is predefined in dependence on an interior actual temperature which is to be set or can be set in the interior of the housing.

With a process management and apparatus of this type, it is easily ensured that at those times at which the water as the storage tank cooling medium in the cold zone 14 does not have the desired low temperature in order to set in conjunction with the internal heat exchanger 21 a desired target temperature in the interior 8, the cold water in the cold zone 14 can be cooled down by means of the cooling unit 25 advantageously to such a level where the desired interior temperature can be set with the internal heat exchanger 21.

The passive cooling system works such that, should the temperature of the external environment of the instrument shelter 1, for example, be higher than the temperature in the interior 8, the cooling or climatization of the interiors 8 is realized by heat exchange with the internal heat exchanger 21, which at predefined times is charged via the input line 22 with a predefined quantity of the cold water drawn off from the cold zone 14. Should switching and/or shut-off elements 18, 19 be present, it can also be provided that the external heat exchanger 9 is switched off by actuation of the switching and/or shut-off elements 18, 19. Insofar as cold water from the cold zone 14 of the storage tank 13 flows via the input line 22 into the internal heat exchanger 21, warmed water is fed via the output line 23 into the warm zone 15 of the storage tank.

As soon as then, for example at night in desert regions, the outside ambient temperature falls below the temperature of the interior 8 of the instrument shelter 1, the cooled cold water collecting in the external heat exchanger 9 at the geodetically lower end is fed via the input line 16 into the cold zone 14 of the storage tank 13. Should switching and/or shut-off elements 18, 19 be present, these can be activated by the control and regulating device 20 such that the external heat exchanger 9 is then here coupled up again to the passive cooling system. Insofar as cooled cold water is fed into the cold zone 14 of the storage tank 13, warm water can be guided out of the warm zone 15 of the storage tank 13 via the output line 17 to the external heat exchanger 9, where it is then cooled in the manner previously described.

With an inventive apparatus and process management of this type, even in such scenarios in which the temperature of the cold water in the cold zone 14 of the storage tank 13 may not be sufficiently cooled to set a desired temperature in the interior 8, it is easily and reliably ensured, by optional connection of the cooling unit 25, that the interior 8 can always be climatized or cooled in the desired manner.

The invention claimed is:
1. A method for operating a passively cooled instrument protective housing having at least one internal heat exchanger disposed in a housing interior, at least one external heat exchanger disposed outside a housing body, and a storage tank for a cooling medium, the storage tank disposed in the housing interior and configured as a stratified storage unit and in which the cooling medium is stored in a stratified configuration in different temperature zones, the at least one internal and the at least one external heat exchanger respectively have at least one output line, by means of the output lines the cooling medium warmed in the respective heat exchangers can be fed to the storage tank, the at least one internal and the at least one external heat exchanger respectively have at least one input line, by means of the input lines a cold cooling medium from the storage tank can be fed to the respective heat exchangers, which comprises the steps of:
  providing at least one cooling unit, the cooling unit having at least one cooling unit evaporator disposed in the storage tank and in the cooling unit evaporator a cooling unit coolant is evaporated with use of heat from the storage tank cooling medium;

providing at least one condenser or liquefier disposed outside the housing body and in which a vaporous or gaseous cooling unit coolant emanating from the cooling unit evaporator is liquefied;

providing at least one switching and/or shut-off device, by means of the at least one switching and/or shut-off device the cooling unit can be switched off and/or can be uncoupled from the passive cooling system formed by the at least one internal heat exchanger, the external heat exchanger and by the storage tank; and providing a control and/or regulating device operatively connected to the cooling unit such that the cooling unit, in dependence on defined parameters is activated or deactivated.

2. The method according to claim 1, which further comprises:

activating the cooling unit when a daytime predefined by means of a time control system is reached and/or when an actual temperature of the cooling medium of the storage tank, registered by the control and/or regulating device, exceeds a predefined target temperature; and deactivating the cooling unit when the actual temperature of the cooling medium of the storage tank, registered by the control and/or regulating device, is no greater than or falls below the defined target temperature, and/or when the daytime predefined by means of the time control system is not yet reached, in that the target temperature of the cooling medium of the storage tank is predefined in dependence on an interior actual temperature which is to be set or can be set in the housing interior.

3. The method according to claim 1, which further comprises selecting the parameters from the group consisting of time parameters and temperature parameters.

* * * * *